(12) United States Patent
Hillyard et al.

(10) Patent No.: US 6,654,241 B2
(45) Date of Patent: Nov. 25, 2003

(54) HIGH AVAILABILITY SMALL FOOT-PRINT SERVER

(75) Inventors: David R. Hillyard, Phoenix, AZ (US); Bill N. Gallas, Queen Creek, AZ (US); Mark D. Summers, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 126 days.

(21) Appl. No.: 09/895,602

(22) Filed: Jun. 29, 2001

(65) Prior Publication Data

US 2003/0002253 A1 Jan. 2, 2003

(51) Int. Cl.[7] .................................................. G06F 1/16
(52) U.S. Cl. ....................... 361/687; 361/683; 361/695; 312/223.1
(58) Field of Search ................................ 361/683, 686, 361/687, 695, 724–727, 800, 816, 818, 689–692, 693, 736, 752, 754–759, 796, 798; 364/708.1; 312/111, 223.1, 223.2, 236, 334.4, 334.8

(56) References Cited

U.S. PATENT DOCUMENTS

| | | | | |
|---|---|---|---|---|
| 5,359,492 A | * | 10/1994 | Porter | 361/683 |
| 5,486,982 A | * | 1/1996 | Hsu | 361/728 |
| 5,602,721 A | * | 2/1997 | Slade et al. | 361/727 |
| 5,737,189 A | * | 4/1998 | Kammersgard et al. | 361/726 |
| 6,025,989 A | * | 2/2000 | Ayd et al. | 361/695 |
| 6,085,925 A | * | 7/2000 | Chung | 220/4.02 |
| 6,157,534 A | * | 12/2000 | Gallagher et al. | 361/683 |
| 6,175,490 B1 | * | 1/2001 | Papa et al. | 361/686 |
| 6,313,988 B1 | * | 11/2001 | Pham | 361/687 |
| 6,328,612 B1 | * | 12/2001 | Chung | 439/717 |
| 6,373,851 B1 | * | 4/2002 | Dadario | 370/445 |
| 6,469,899 B2 | * | 10/2002 | Hastings et al. | 361/724 |

FOREIGN PATENT DOCUMENTS

| | | | | |
|---|---|---|---|---|
| EP | 1113646 A1 | * | 7/2001 | H04L/29/06 |
| GB | 2278941 A | * | 11/1993 | G06F/1/16 |
| GB | 2362791 A | * | 11/2001 | G06F/1/16 |

OTHER PUBLICATIONS

"Overview of 'FriendlyNet Wireless–Ready Cable/DSL Router and AeroLan PC Card';" (Visited Oct. 10, 2001); www.asante.com/products/routers/3002al/index.heml; 4 pages; Date unknown.

"Product Information of 'BEFSR41—EtherFast 4–Port Cable/DSL Router';" (Visited Oct. 10, 2001); www.linksys.com/products/product.asp?prid=20&grid=5; 3 pages; Date unknown.

"Overview of 'Intel InBusiness Hubs for Small Business';" (Visited Oct. 10, 2001); www.intel.com/networks/smallbiz/inbusiness_hubs.htm; 3 pages; Date unknown.

Network engines, Inc., StorageEngine Voyager Specification sheet, www.networkengines.com, Nov. 2000, 2 pages.

Network Engines, Inc., WebEngine Sierra Specification sheet, www.networkengines.com, Mar. 2001, 2 pages.

Sun Cobalt, CacheRaQ 4 Data Sheet, www.cobalt.com/products/pdfs/datasheet.cacheraq4.pdf, Apr. 2001, 2 pages.

* cited by examiner

Primary Examiner—Michael Datskovsky
(74) Attorney, Agent, or Firm—Paul E. Steiner

(57) ABSTRACT

A novel high availability small foot-print server is described in which four or more separate computer modules and associated power supply and communication connections or other units are clustered together in a single server chassis to occupy a limited amount of space while providing maximum accessibility for administrative, maintenance, installation, or other purposes. Each separate computer module is equipped with its own fan or blower box to provide redundancy in the case of fan or blower box failure. The server chassis is contoured to provide for natural interconnection such that more than one high availability small foot-print server may be stacked together to take up the same amount of floor, shelf, or desk space as a single server.

25 Claims, 6 Drawing Sheets

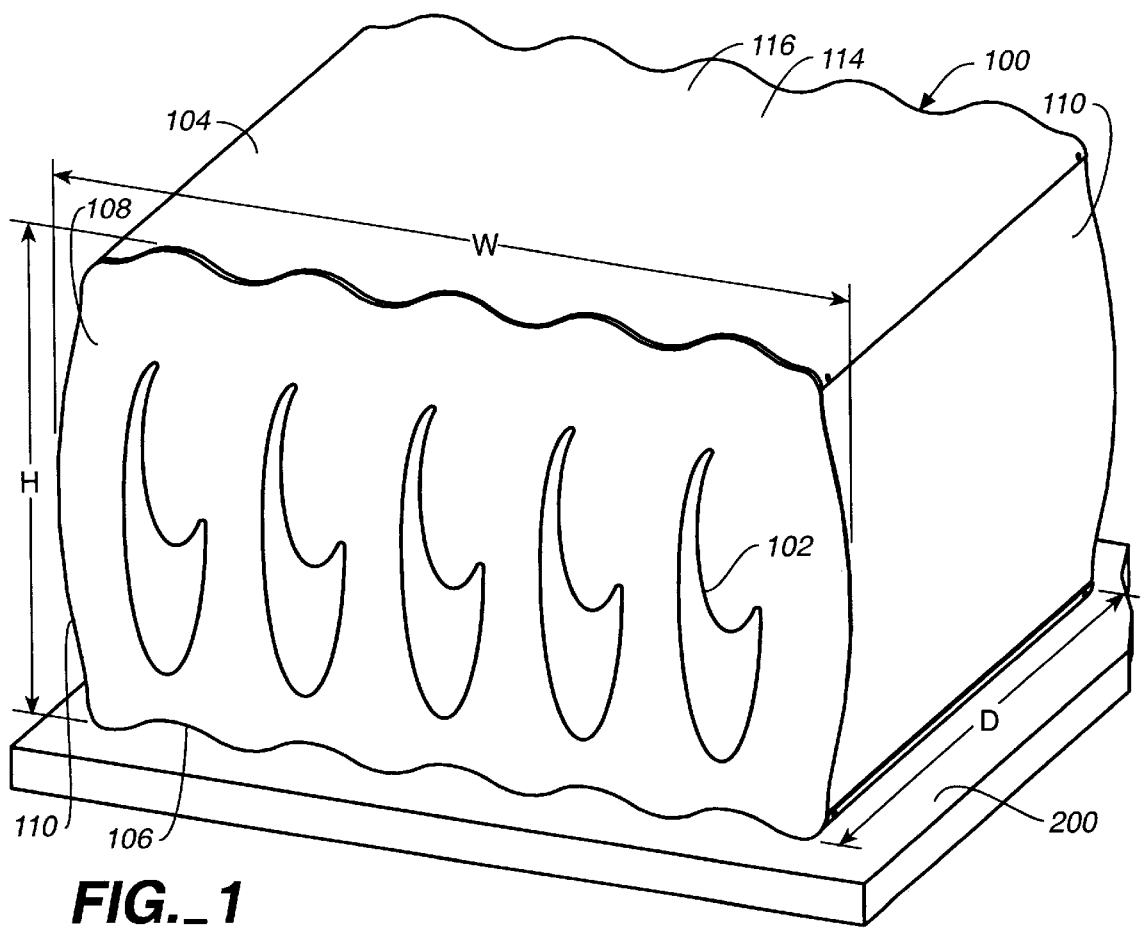
FIG._1
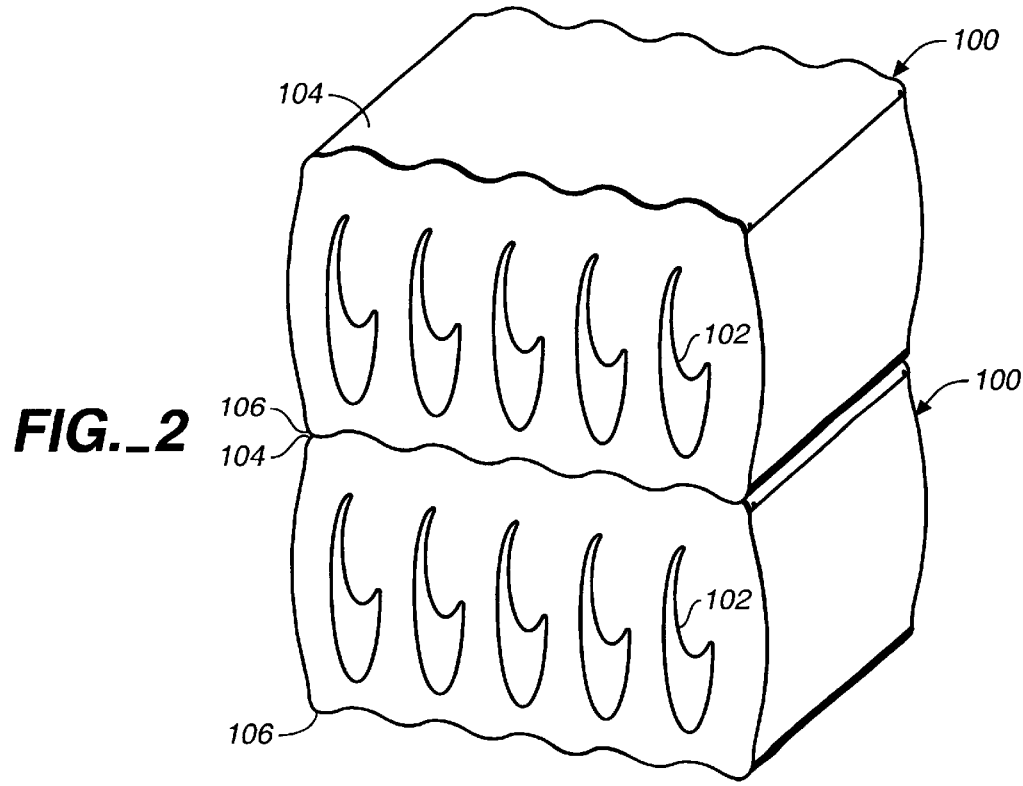
FIG._2

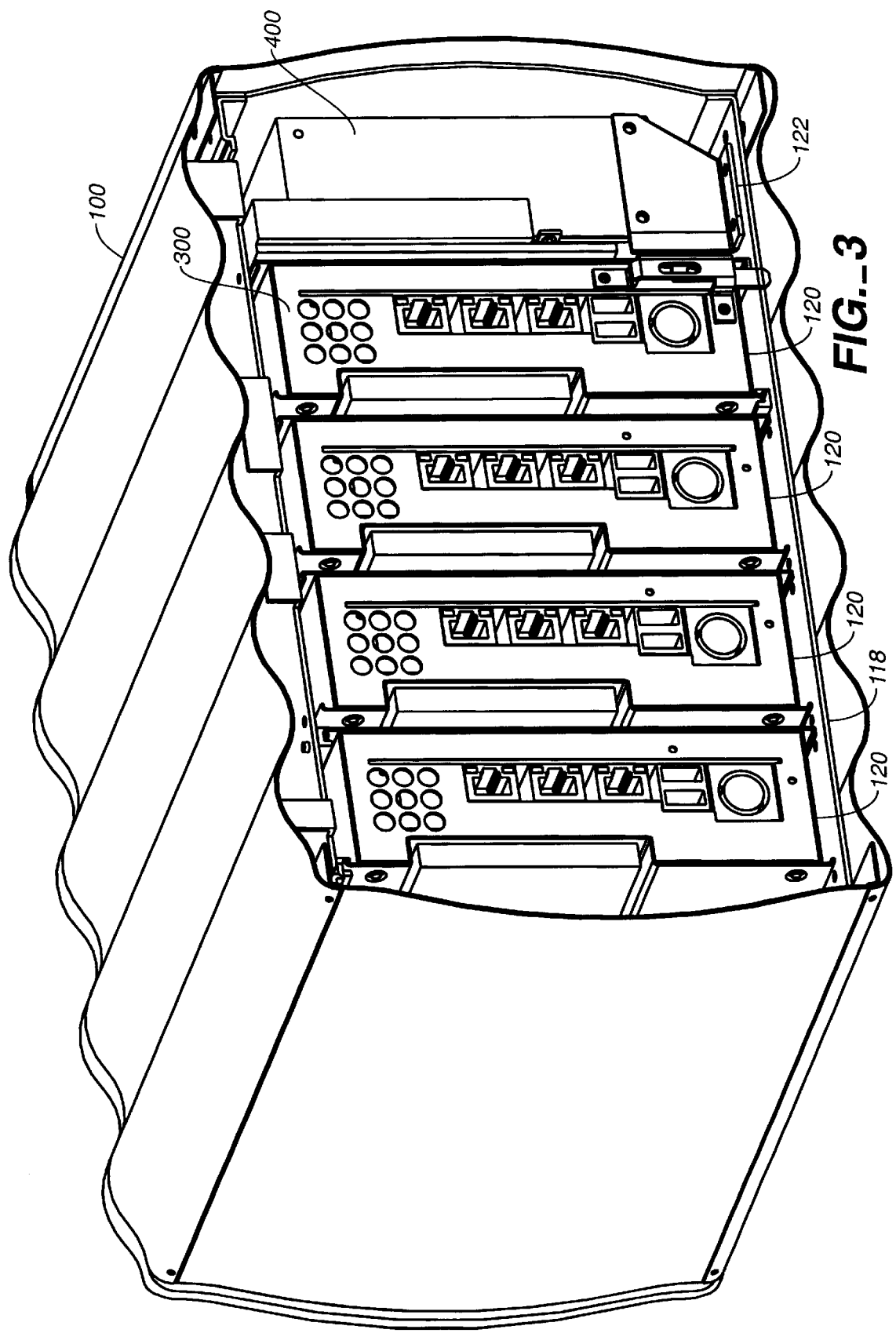
FIG._3

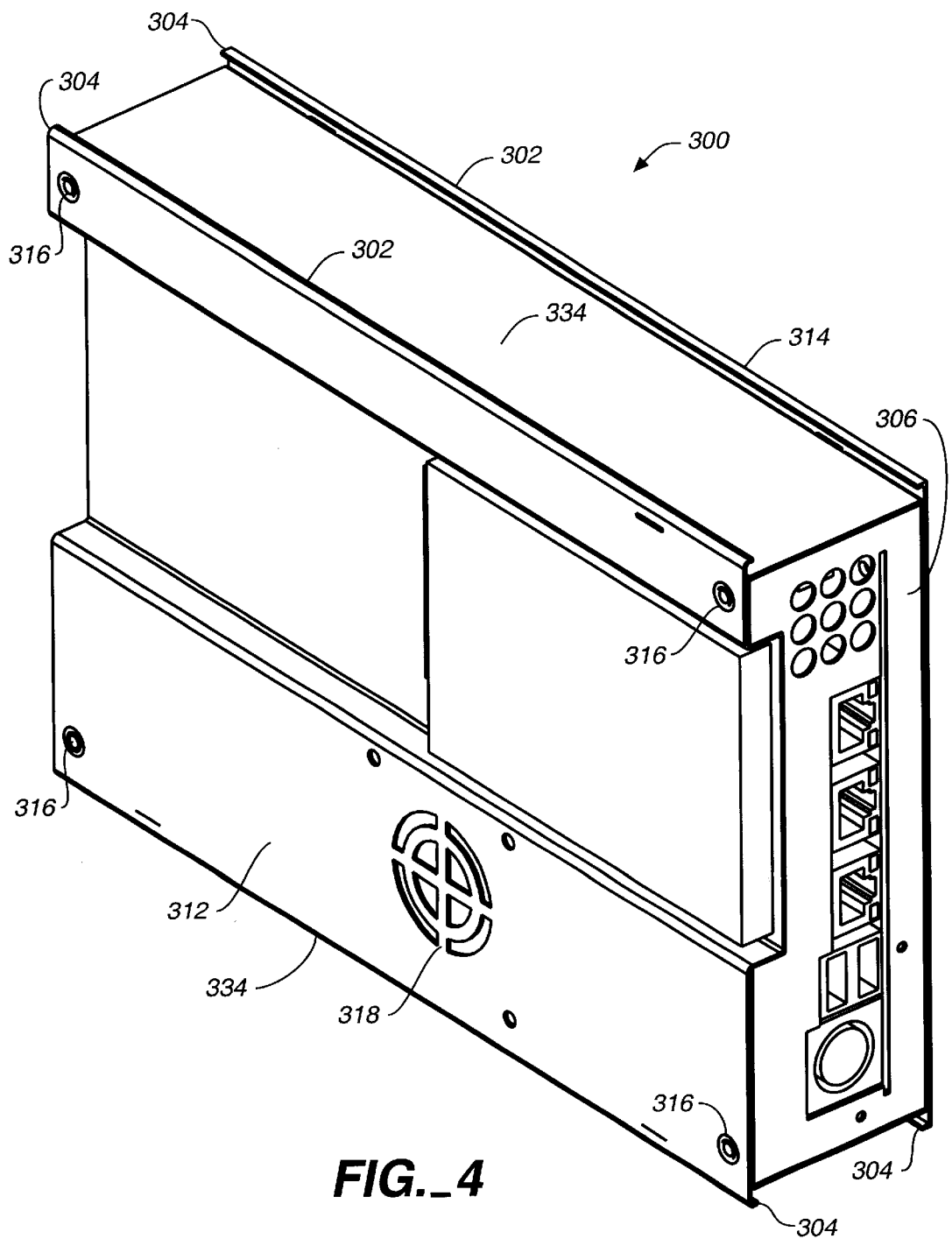
FIG._4

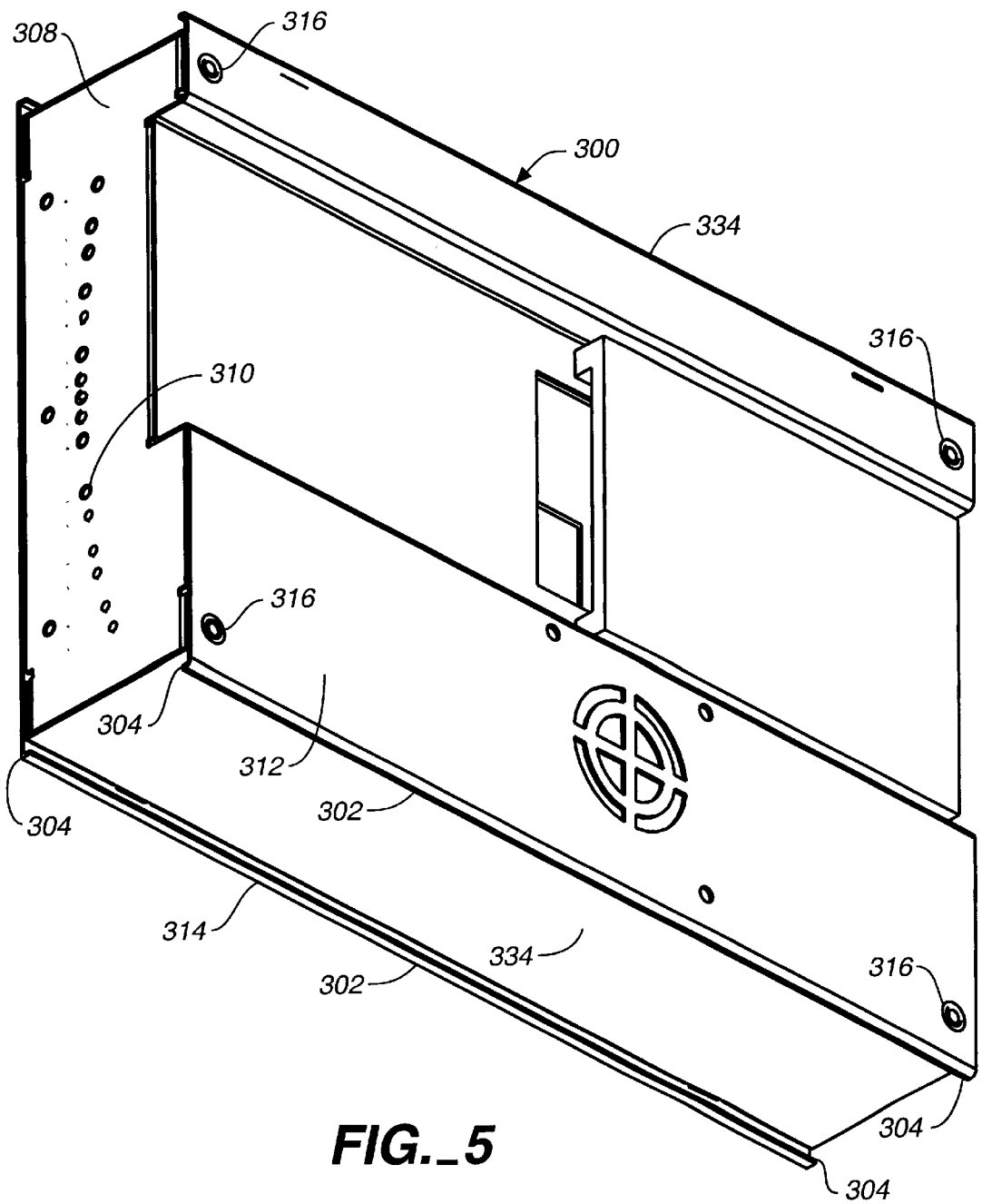
FIG._5

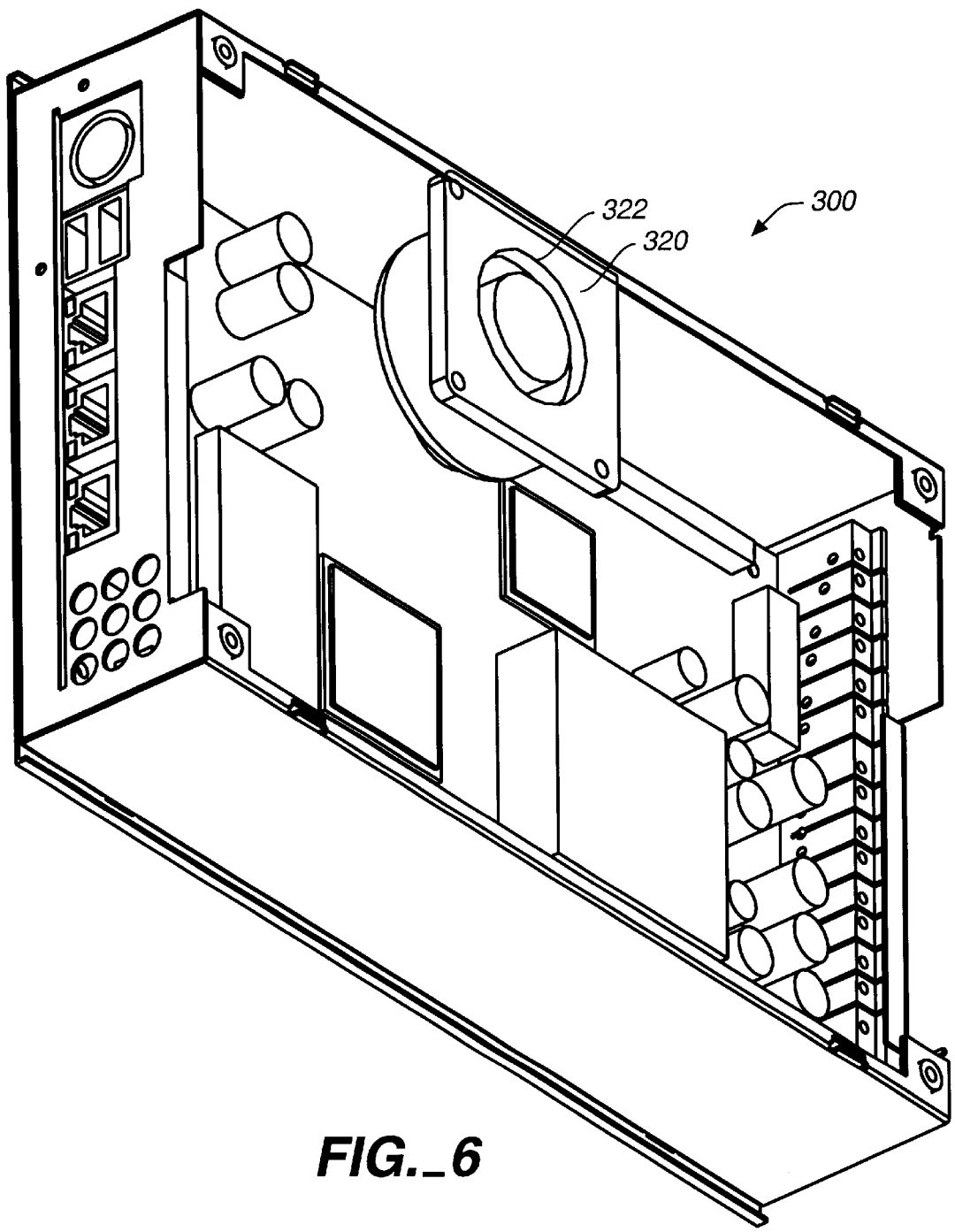
FIG._6

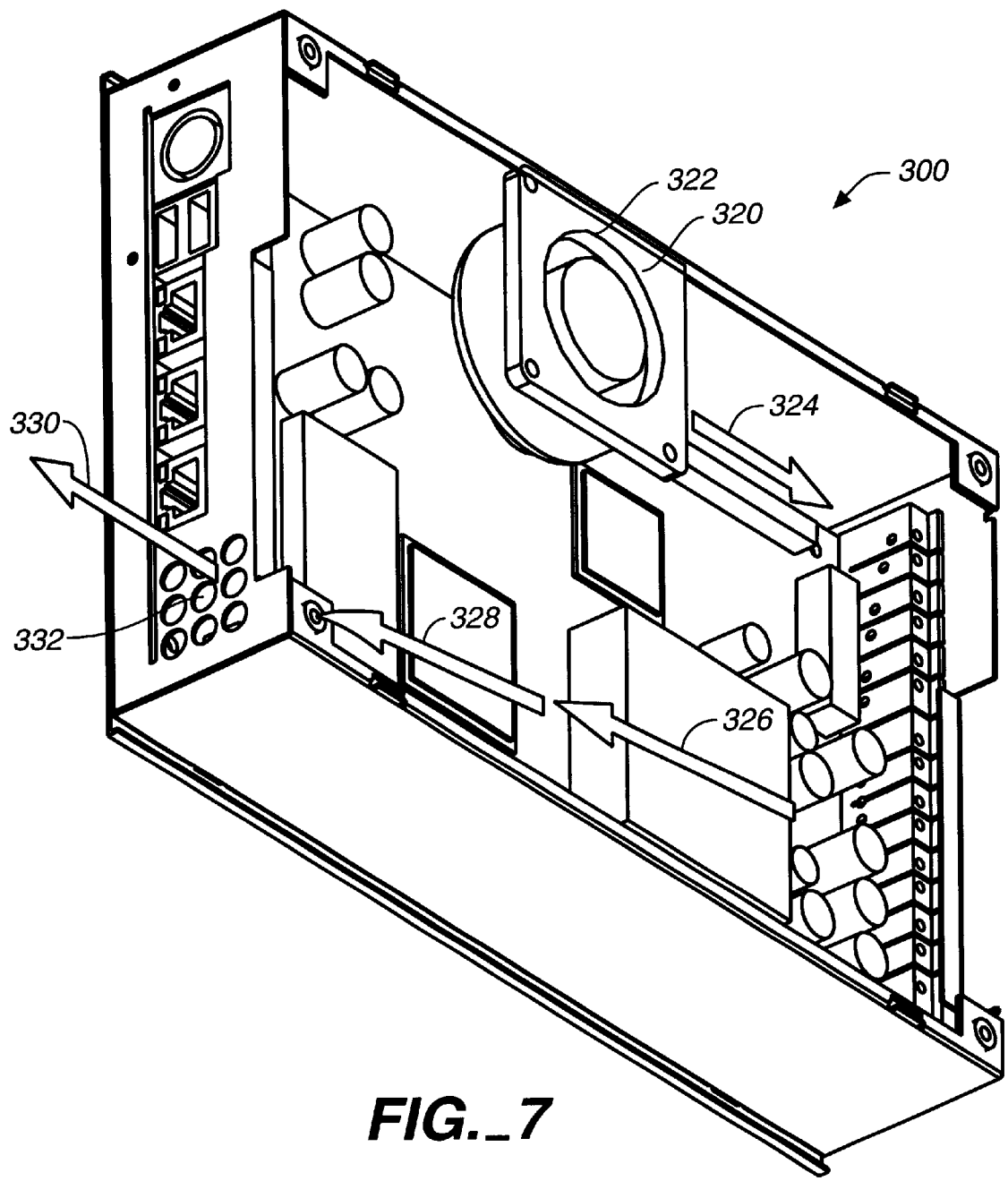
FIG._7

HIGH AVAILABILITY SMALL FOOT-PRINT SERVER

CROSS-REFERENCE TO RELATED APPLICATIONS

This utility application is related to concurrently filed design applications entitled, "Small Foot-Print Server Chassis," U.S. patent application Ser. No. 29/144,388; and "Server Face Plate," U.S. patent application Ser. No. 29/144,325.

FIELD OF THE INVENTION

The present invention relates generally to computer servers. In particular, the present invention relates to an improved server design for housing and cooling multiple computer modules, power supplies, bus routers, and the like, in a limited space.

BACKGROUND OF THE INVENTION

Advances in computer technology have allowed individuals and businesses to operate multiple full-scale computer server systems from within the home and small or remote offices. In this environment, or any other environment where floor and desk space is limited, it is important that the computer equipment occupies a relatively small amount of space while receiving adequate ventilation and access to power supplies and network connections that enable communication over the Internet or a private network.

There are a number of prior art solutions to assist with the installation of multiple pieces of computer equipment in a compact space, such as the traditional rack mounted server or a Local Area Network (LAN) closet. For example, servers are housed in large computer cases (i.e. mini-towers) that can either sit on the floor or that can be built into a rack-mounted chassis. The traditional rack-mounted servers are approximately 19 inches wide, and do not to make the most efficient use of space. They also fail to adequately address the ventilation, communication, and power supply needs of the computers they house. The LAN closet, while a compact storage area, renders the computers somewhat inaccessible and may also fail to address the necessary ventilation, communication, and power supply needs of the computers that they house.

Another popular prior art solution for simplifying the installation of multiple pieces of computer equipment is to make them stackable, thereby eliminating the need for an external rack. For example, Intel Corporation, the assignee of the present application for patent, sells a line of 5- and 8-port communication hubs under the trademark Intel InBusiness®, that utilize a stackable modular design. However, such individual stackable modules also fail to address the ventilation, communication, and power supply needs of multiple pieces of equipment in a limited space. For example, multiple central processing units (CPUs) present in a typical server system require a reliable cooling flow of air (i.e. system air) in order to operate properly. Since the stackable, rack-mounted, and LAN closet solutions do not address the individual system air cooling requirements of each CPU, there exists an undesirable single point of failure if the air cooling system in the area where the CPUs are located fails.

What is needed, therefore, is a new approach that simplifies the installation of multiple pieces of computer equipment in a limited space, while providing support for the ventilation, communication, and power supply needs of each piece of equipment in a manner that is accessible, fault-tolerant, and efficient.

BRIEF DESCRIPTION OF DRAWINGS

The present invention will be described by way of exemplary embodiments, but not limitations, illustrated in the accompanying drawings in which like references denote similar elements, and in which:

FIG. 1 illustrates a perspective view of a high availability small foot-print server chassis in accordance with one embodiment;

FIG. 2 illustrates a perspective view of two high availability small foot-print server chassis stacked one on top of the other in accordance with one embodiment;

FIG. 3 illustrates a rear perspective view of a high availability small foot-print server chassis housing multiple computer modules in accordance with one embodiment;

FIG. 4 illustrates a front perspective view of a single computer module capable of being housed in a high availability small foot-print server chassis as illustrated in FIG. 3 and in accordance with one embodiment;

FIG. 5 illustrates a front perspective view of the single computer module illustrated in FIG. 4 in accordance with one embodiment;

FIG. 6 illustrates a rear perspective view of the interior of the single computer module illustrated in FIG. 4 in accordance with one embodiment; and FIG. 7 illustrates the flow of air through the interior of the single computer module illustrated in FIG. 6 in accordance with one embodiment.

DETAILED DESCRIPTION OF THE INVENTION

In the following description various aspects of the present invention, a high availability small foot-print server will be described. Specific details will be set forth in order to provide a thorough understanding of the present invention. However, it will be apparent to those skilled in the art that the present invention may be practiced with only some or all of the described aspects of the present invention, and with or without some or all of the specific details. In some instances, well-known features may be omitted or simplified in order not to obscure the present invention.

Parts of the description will be presented using terminology commonly employed by those skilled in the art to convey the substance of their work to others skilled in the art, including terms that refer to computer system components, such as servers, routers, hubs, buses, hard drives, memory, input/output (I/O), racks, chassis, computer cases, power supplies, and the like. The terminology further includes operations performed by a computer system, and their operands, such as transmitting, receiving, and the like. As well understood by those skilled in the art, these operands take the form of electrical, magnetic, or optical signals, and the operations involve storing, transferring, combining, and otherwise manipulating the signals through electrical, magnetic or optical components of a system. The term system includes general purpose as well as special purpose arrangements of these components that are standalone, adjunct or embedded.

Various operations will be described as multiple discrete steps performed in turn in a manner that is most helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

FIG. 1 illustrates a perspective view of a high availability small foot-print server chassis 100 in accordance with one embodiment of the present invention. As shown, the server chassis 100 is an approximately rectangular-shaped cube for housing multiple server units. The server chassis 100 comprises five surfaces including a top surface 104, a bottom surface 106 disposed substantially parallel to the top surface 104, a front surface 108 disposed substantially perpendicular to the top 104 and bottom 106 surfaces, and opposing side surfaces 110. The opposing side surfaces 110 are uniformly disposed substantially parallel to each other while at the same time substantially perpendicular to the top 104, bottom 106, and front 108 surfaces. The rear of the server chassis 100 is open in order to receive one or more server modules, power supply, communications hub, or other server component housed within the server chassis 100.

In one embodiment, the server chassis 100 may be integrally constructed of a substantially rigid material, the approximate dimensions of which are a width of 12 inches by a depth of 9 inches by a height of 7 inches, thereby making the server chassis 100 suitable for placing on a desktop or shelf, without occupying the majority of the desktop or shelf surface 200. Of course, other dimensions of the server chassis 100 may be used without departing from the scope of the invention, as long as the server chassis 100 creates a relatively small foot-print on a typical desktop or shelf surface 200, and is sufficiently small in height to reasonably allow three or more server chassis 100 to be stacked atop one another. In one embodiment, the server chassis 100 may also be assembled, in whole or in part, from individually formed surfaces 104, 106, 108, and 110, joined or fastened together in a permanent or semi-permanent (i.e. allowing for disassembly) fashion into a single server chassis 100 without departing from the scope of the invention.

In the illustrated embodiment, the front surface 108 of the server chassis 100 contains a series of openings 102 that allow for visual inspection of a server computer module, power supply, communications hub, or other server component contained within the server chassis 100, including the visual inspection of any status lights or indicators on the server component that may be visible through the openings 102. The remaining areas of the front surface not taken up by the openings 102 may be either flat or contoured without departing from the scope of the invention. In one embodiment, the opposing side surfaces 110 may be contoured in a convex fashion as illustrated; however other contours of the side surfaces 110 may also be employed without departing from the scope of the invention, including side surfaces 110 that are substantially flat, or without any contour.

The top surface 104 and bottom surface 106 are compatibly contoured into depressed areas 114 and raised areas 116 such as the opposing sinusoidal wave contours in the illustrated embodiment. As illustrated in FIG. 2, the contours of the top 104 and bottom 106 surfaces are such that one server chassis 100 may be stacked on top of another identically contoured server chassis 100 in a natural interconnecting fashion. Other compatible contours of the top 104 and bottom 106 surfaces other than the illustrated opposing sinusoidal wave contours may be employed without departing from the scope of the invention. An unlimited number of server chassis 100 may be interconnected in a stacked fashion as illustrated, although a reasonable stack would be two (as illustrated) or three server chassis to provide up to twelve or so server computer modules and associated power supplies and communication connections in a limited space.

FIG. 3 illustrates a rear perspective view of a high availability small foot-print server chassis 100 housing multiple server computer modules 300 in accordance with one embodiment. As illustrated, the server chassis 100 is open in the rear and encases an internal rack 118 that is comprised of multiple slots 120 that may each be occupied by a single computer module 300, with at least one slot 122 reserved for a power supply, communications hub, or other unit 400, that is capable of providing power and/or an integrated network interface to individual computer modules 300. In one embodiment, the internal rack 118 is provided for ease of inserting or removing the computer modules 300 or other unit 400 into or from the server chassis 100 in a sliding fashion. In one embodiment, the internal rack 118 may be integrated with the server chassis 100 such that the internal rack 118 is fixed and each computer module 300 or other unit 400 is inserted or removed individually from server chassis 100 in a sliding fashion.

In one embodiment the rear of server chassis 100 is entirely open allowing unfettered access to each single computer module 300 housed in slots 120 of server chassis 100, as well as unfettered access to the power supply, communications hub, or other unit 400 housed in slot 122 of internal rack 118 encased in server chassis 100.

In one embodiment, the integrated network interface of unit 400 may be an Ethernet hub or switch, which is known in the art. Alternatively, the integrated network interface of unit 400 may be an Infiniband hub, which is an emerging standard for an interconnect network protocol that is known in the art.

FIGS. 4 and 5 illustrate a rear and front perspective view, respectively, of a single computer module 300 capable of being housed in a high availability small foot-print server chassis 100 as illustrated in FIG. 3 and in accordance with one embodiment. The computer module 300 may be a embedded computer with a hard drive, memory and associated I/O as is known in the art. The computer module 300 is encased in an Electro-Magnetic Compatibility (EMC) enclosure 302, also referred to as a "Faraday box," that covers all sides of the computer module 300, including the top 312, bottom 314, front 306, rear 308, and the two sides 334 of the computer module 300 to shield each computer module 300 from the neighboring computer modules 300 housed in the other slots 120 of internal rack 118 encased by server chassis 100. In one embodiment, the EMC enclosure 302 is provided with a lip 304 extending lengthwise along the top and bottom side edges. The lip 304 of EMC enclosure 302 is designed to fit within each individual slot 120 of rack 118 in server chassis 100 so as to secure the insertion or removal of the server computer module 300 as well as to guide the computer module 300 into proper position within the slot 120. In one embodiment, the EMC enclosure 302 is fastened to computer module 300 using a fastener 316 in a manner that is known in the art. In one embodiment, the EMC enclosure 302 is equipped on the top 312 with a vent 318 that is positioned over a fan (320 in FIG. 6) within computer module 300 to allow the unobstructed flow of air into the fan intake opening (322 in FIG. 6).

In one embodiment, the rear end 306 of computer module 300 illustrated in FIG. 4 contains, among other features, the outlets and inlets for the various ports, connections, and sockets of the computer module 300 for receiving cable, modem, or peripheral connections, whereas the front end 308 of the computer module 300 illustrated in FIG. 5 contains, among other features, the various status or other indicators 310 that may be visible through openings 102 of server chassis 100.

FIG. 6 illustrates computer module 300 with the top 312 of the EMC enclosure 302 removed to reveal the interior and selected components therein. As illustrated, each individual computer module 300 includes, among other components, its own fan or blower box 320 equipped with a fan intake opening 322 for drawing in air through the vent 318 of the EMC enclosure 302 from the surrounding environment within the server chassis 100 in which the computer module 300 is housed.

FIG. 7 again illustrates computer module 300 with the top 312 of the EMC enclosure 302 removed to reveal the interior and selected components therein, and further illustrates the flow of air 324 from the fan or blower box 320. As illustrated, a continuing air flow 326 and 328, cools the interior and other components of computer module 300, with an exiting air flow 330 out of annular openings 332 in the rear 306 of computer module 300 to exit finally through the open rear of the server chassis 100 in which the computer module 300 is housed. The provision of a fan or blower box 320 in each individual computer module 300 housed in server chassis 100 insures that there is not a single point of failure in the air cooling system, since without proper air cooling, the computer module 300 will fail. By eliminating this single point of failure in the air cooling system, the small foot-print server is capable of providing redundancy amongst the computer modules 300 such that one computer module 300 can take over when a neighboring one fails due to air cooling or other failure. Therefore, the small foot-print server of the present invention provides for improved fault-tolerance and high availability.

Accordingly, a novel high availability small foot-print server is described in which one or more separate computer modules 300 and associated power supply and communication connections or other unit 400 may be clustered together in a single server chassis 100 to occupy a limited amount of space while providing maximum accessibility for administrative, maintenance, installation, or other purposes. For example, one computer module 300 may be slaved to another neighboring computer module 300 housed in the same server chassis 100, or a single computer module 300 can be serviced or replaced without bringing down the neighboring modules 300. Clustering the computer modules 300 together with the supporting unit 400 in an integrated fashion can facilitate a software-controlled automatic fail-over such that the small foot-print server of the present invention provides improved fault tolerance and high availability. In addition, each separate computer module 300 is equipped with its own fan or blower box 320 to provide further redundancy in the case of fan or blower box failure. The server chassis 100 is contoured to provide for natural interconnection such that more than one high availability small foot-print server may be stacked together to take up the same amount of floor, shelf, or desk space as a single server chassis 100 would. From the foregoing description, those skilled in the art will recognize that many other variations of the present invention are possible. Thus, the present invention is not limited by the details described. Instead, the present invention can be practiced with modifications and alterations within the spirit and scope of the appended claims.

What is claimed is:

1. A small foot-print server comprising:
   a server chassis having a small foot-print;
   a first computer module housed in the server chassis, the first computer module having a first fan;
   a second computer module housed in the server chassis, the second computer module having a second fan operating independently of the first fan; and
   a communication module housed in the server chassis having an integrated network interface coupled to the first and second computer modules,
   wherein a contour of a top surface of the server chassis is shaped to permit stacking a second server chassis atop the server chassis in a natural interconnecting fashion.

2. The small foot-print server of claim 1, further comprising:
   a power supply module housed in the server chassis coupled to the first and second computer modules.

3. The small foot-print server of claim 1, wherein the small foot-print is not more than 12 inches wide by 9 inches deep.

4. The small foot-print server of claim 1, wherein the second computer module is a backup to the first computer module when the first fan fails.

5. The small foot-print server of claim 1, wherein the first and second computer modules share access to the integrated network interface.

6. The small foot-print server of claim 2, wherein the first and second computer modules derive power from the power supply module.

7. The small foot-print server of claim 1, wherein the first computer module is housed in the server chassis in a first slot.

8. The small foot-print server of claim 7, wherein the second computer module is housed in the server chassis in a second slot.

9. The small foot-print server of claim 8, wherein the first computer module is capable of insertion into the first slot without disturbing the second computer module.

10. The small foot-print server of claim 8, wherein the first computer module is capable of insertion into the first slot without disturbing the second computer module in the second slot.

11. The small foot-print server of claim 8, wherein the first computer module is capable of removal from the first slot without disturbing the second computer module in the second slot.

12. The small foot-print server of claim 1, wherein the integrated network interface is an Ethernet hub.

13. The small foot-print server of claim 1, wherein the integrated network interface is an Ethernet switch.

14. The small foot-print server of claim 1, wherein the integrated network interface is an Infiniband hub.

15. The small foot-print server of claim 1, wherein the contour of the top surface of the server chassis is a first sinusoidal wave, and a contour of a bottom surface of the server chassis is a second sinusoidal wave, the second sinusoidal wave contour being aligned to oppose the first sinusoidal wave contour to achieve a natural interconnect between the stacked chassis.

16. A server chassis comprising:
   a receptacle having five sides perpendicularly disposed to form an opening on the sixth side to receive a first computer module having a first fan, and second computer module having a second fan independent of the first fan, the first computer module operating to automatically fail over to the second computer module when the first fan of the first computer module fails, the receptacle having a small foot-print on a horizontal surface, wherein atop side and a bottom side of the saner chassis is shaped to permit stacking a second server chassis atop the server chassis in a natural interconnecting fashion.

17. The server chassis of claim 16, wherein the opening receives a communication module that is capable of coupling to the first and second computer module to provide a common integrated network interface.

18. The server chassis of claim 16, wherein the opening receives a power module that is capable of coupling to the first and second computer module to provide a common power supply.

19. The server chassis of claim 16, wherein the top side of the server chassis is shaped as a first sinusoidal wave, and the bottom side is shaped as a second sinusoidal wave, wherein the second sinusoidal wave shape is aligned to oppose the first sinusoidal wave shape to achieve a natural interconnect between the stacked chassis.

20. The server chassis of claim 16, wherein the small foot-print is not more than 12 inches wide by 9 inches deep on the horizontal surface.

21. A method for a high availability small foot-print sewer comprising:

inserting a first computer module into a server chassis having a small foot-print, the first computer module having a first fan;

inserting a second computer module into the server chassis without disturbing the first computer module, the second computer module having a second fan operating independently of the first fan;

controlling the first computer module to automatically fail over to the second computer when the first fan fails; and stacking the server chassis atop a second server chassis, wherein a contour of a bottom surface of the server chassis and a contour of a top surface of the second server chassis are compatibly shaped to permit the server chassis to interconnect to the second server chassis in a natural manner.

22. The method of claim 21, further comprising:

inserting a communication module into the server chassis, the communication module providing an integrated network interface to the first and second computer modules.

23. The method of claim 21, further comprising:

inserting a power module into the server chassis, the power supply module providing a common power supply to the first and second computer modules.

24. The method of claim 21, wherein the small foot-print is not more than 12 inches wide by 9 inches deep, enabling the server chassis to occupy a limited space on a horizontal work surface.

25. The method of claim 21, wherein the contour of the bottom surface of the server chassis is a first sinusoidal wave, and a contour of the top surface of the second server chassis is a second sinusoidal wave, the second sinusoidal wave contour being aligned to oppose the first sinusoidal wave contour to achieve a natural interconnect between the stacked chassis.

* * * * *